United States Patent
Cheng

(10) Patent No.: US 6,638,858 B2
(45) Date of Patent: Oct. 28, 2003

(54) HOLE METAL-FILLING METHOD

(75) Inventor: David C. H. Cheng, Taoyuan Hsien (TW)

(73) Assignee: Unimicron Taiwan Corp., Taoyuan Hsien (TW)

(*) Notice: Subject to any disclaimer, the term of this patent is extended or adjusted under 35 U.S.C. 154(b) by 100 days.

(21) Appl. No.: 10/020,700

(22) Filed: Oct. 30, 2001

(65) Prior Publication Data

US 2003/0082896 A1 May 1, 2003

(51) Int. Cl.[7] ............................................. H01L 21/44
(52) U.S. Cl. ..................................... 438/678; 228/248.1
(58) Field of Search ....................... 438/678; 228/248.1, 228/122.1

(56) References Cited

U.S. PATENT DOCUMENTS

| | | | | |
|---|---|---|---|---|
| 5,465,898 A | * | 11/1995 | Schulz-Harder et al. | 228/122.1 |
| 5,921,462 A | * | 7/1999 | Gordon | 228/91 |
| 5,941,449 A | * | 8/1999 | Le Coz et al. | 228/248.1 |
| 6,270,002 B1 | * | 8/2001 | Hayashi et al. | 228/246 |
| 6,428,328 B2 | * | 8/2002 | Haba et al. | 439/70 |

* cited by examiner

*Primary Examiner*—John F. Niebling
*Assistant Examiner*—Christopher Lattin
(74) *Attorney, Agent, or Firm*—J. C. Patents

(57) ABSTRACT

A hole metal-filling method, applied to hole filling and electroplating a printed circuit board which has been mechanical-drilled with holes. A plurality of holes is drilled in a substrate. The substrate is placed on a platform. A plurality of metal balls is disposed on a surface of the substrate. By vibrating the platform, a part of the metal balls roll into the holes, while the metal balls not rolling into the holes are removed. The substrate is then placed on a press down unit. The metal balls in the holes are pressed to level with surfaces of the substrate. The substrate is directly electroplated for forming a plating layer closely dovetail to the metal balls.

10 Claims, 4 Drawing Sheets

HOLE METAL-FILLING METHOD

BACKGROUND OF THE INVENTION

1. Field of the Invention

The invention relates in general to a hole metal-filling method, and more particularly, to a hole filling and electroplating method for a printed circuit board which has been mechanically drilled with holes.

2. Description of the Related Art

In addition to the great demand in functionality, the consumers also require the electronic product to be light, thin, short and small. Therefore, the integration has to be higher and higher with more and more powerful functions. Consequently, the printed circuit board (PCB) to equip the electronic devices is fabricated with more and more layers, for example, from a single layer to 2, 6, 8 or even 10 layers. The electronic devices can thus be formed on the printed circuit board more densely with a smaller occupancy of surface area.

However, as layers of the multi-layer circuit board increase, the fabrication process becomes more complex, and the production time is also lengthened. The subsequent testing process is also increased with more complex steps and longer time.

In FIG. 1A, an inner substrate 14 with two layers of circuit 12 is shown. The circuit 12 can be located at two sides of the insulation layer 10 and formed using photolithography and etching process.

In FIG. 1B, a surface of the inner circuit 12 is oxidized to obtain a coarse surface, so as to improve the bonding performance between the inner circuit 12 and the insulator. A layer of rubber sheet 16 and a layer of copper foil 18 are located and laminated at two sides of the substrate 14. The next layer of circuit is then fabricated at two sides of the substrate 14. However, the fabrication of the next layer of circuit has to be performed after bonding and curing the rubber sheet 16 with the inner circuit 12. To bond the rubber sheet 16 with the inner circuit 12, the rubber sheet 16 has to be heated and pressed with a process called thermal press. The rubber sheet 16 can then be hardened and closely adjacent to the inner circuit 12. The temperature is then reduced, while the press is continuously applied in a cold pressing process.

In FIG. 1C, the interconnecting holes and the component holes 20 to install components and to interconnect various layers have to be drilled first. The holes 20 are then plated with copper with a plating through hole (PTH) process to form a copper foil in the holes. An outer circuit layer is then formed using photoresist layer to etch the copper foils 18, 22.

Generally speaking, an electroplating process is used to form the copper foil 22 in the hole 20. To plate a cylindrical shape of copper in the hole 20, a very long plating time is required. Thus, the cost is high, and the applicability of the hole 20 with a diameter more than 0.2 mm is not desired.

SUMMARY OF THE INVENTION

The invention provides a metal-filling method of a hole. After forming and electroplating a hole in a printed circuit board, this method is performed. In this method, a substrate is provided. A plurality of holes is drilled through the substrate. The substrate is placed on a platform, and a plurality of metal balls is disposed on the substrate. By vibrating the platform, a part of the metal balls roll into the holes. The metal balls not rolling into the holes after vibrating the platform are removed. The substrate is then placed on a press down unit and pressed until the metal balls within the holes are level with the surface of the substrate. An electroplating step is performed on the substrate directly to form a plating layer closely adjacent to the metal balls.

While applying the above method to printed circuit board, as copper is selected as the material of the metal balls, the diameter of the holes in the substrate can be increased. Due to the good electrical and thermal conductivity, the copper metal balls can also used as heating dissipation members such as ball grid array (BGA) package device. In addition, while replacing laser via with mechanical via in the product with high density interconnection (HDI), the fabrication cost is greatly reduced.

The laser used typically includes gas laser, solid laser such as $CO_2$ laser, yttrium-aluminum-garnet (YAG) laser with a wavelength of 10.6 micron, 1.064 micron and a beam size of 0.1 mm and 0.05 mm, respectively.

Both the foregoing general description and the following detailed description are exemplary and explanatory only and are not restrictive of the invention, as claimed.

DESCRIPTION OF THE PREFERRED EMBODIMENTS

FIGS. 2A to 2G are cross sectional views of the hole metal-filling process in one embodiment of the invention.

Figure 1A:
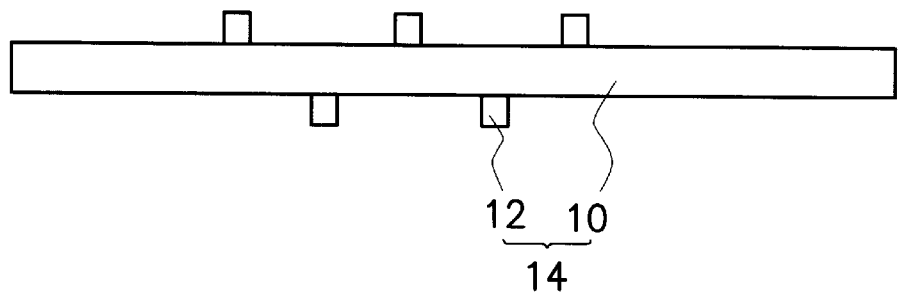
FIGS. 1A to 1C shows the cross sectional views of a conventional process for fabricating a multi-layer circuit board.
Figure 1B:
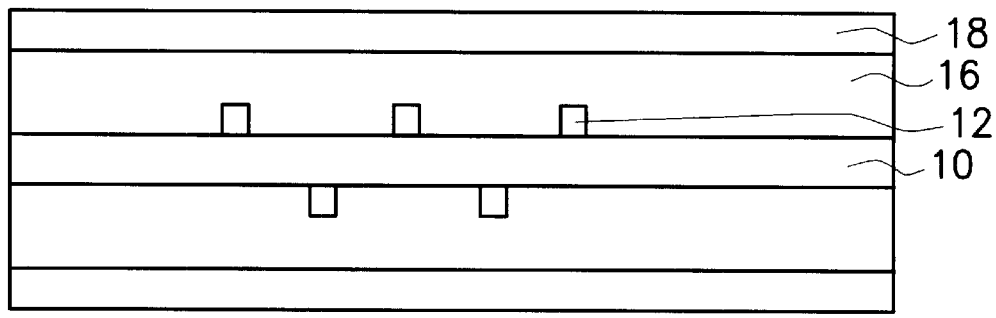
Figure 1C:
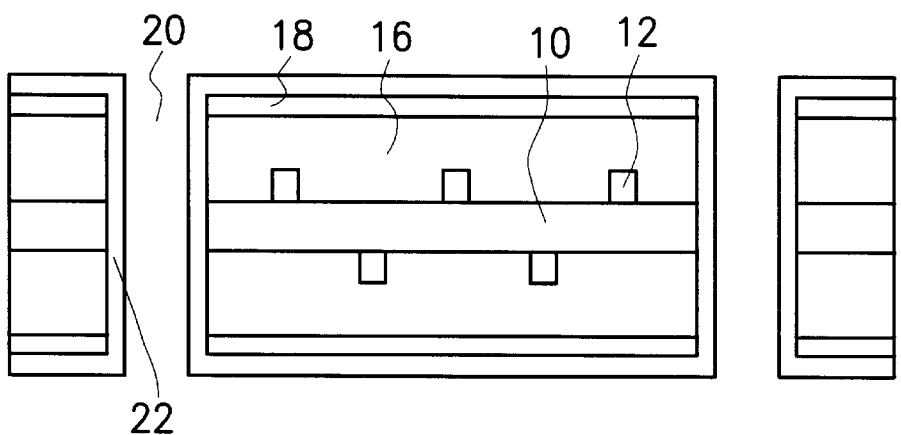
Figure 2A:
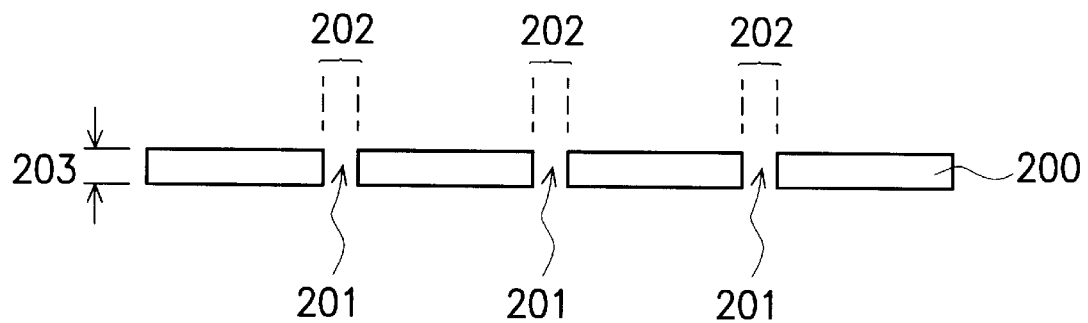
FIGS. 2A to 2G shows the cross sectional views of hole metal-filling process, according to a preferred embodiment of the invention.

In FIG. 2A, a substrate 200 is provided. The substrate 200 includes, for example, a printed circuit board with high density interconnection. The fabrication process of the substrate 200 is similar to those illustrated in FIGS. 1A and 1B. The substrate 200 has a thickness 203. A plurality of holes 201 with diameter 202 of about 300 mm is formed in the substrate 200.

Figure 2B:
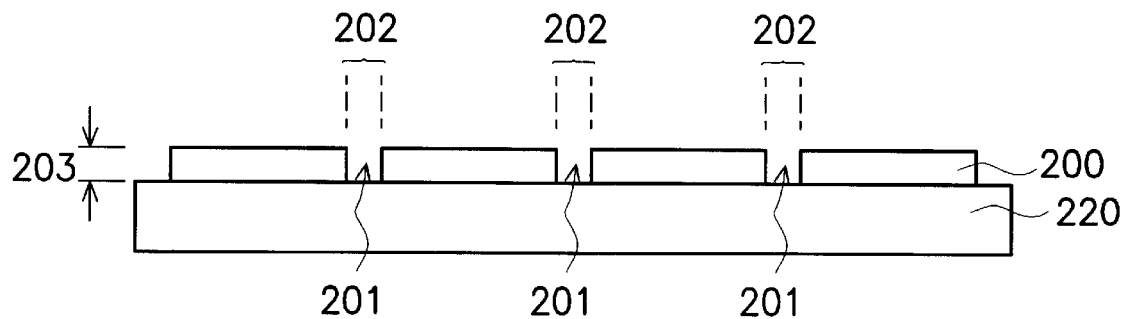

In FIG. 2B, the substrate 200 is placed on a platform 220 with a vibration function. The platform 220 includes a machine platform with a high degree of horizontal with a device to hold the substrate 200, so as to prevent the substrate 200 from falling out of the platform during vibration.

Figure 2C:
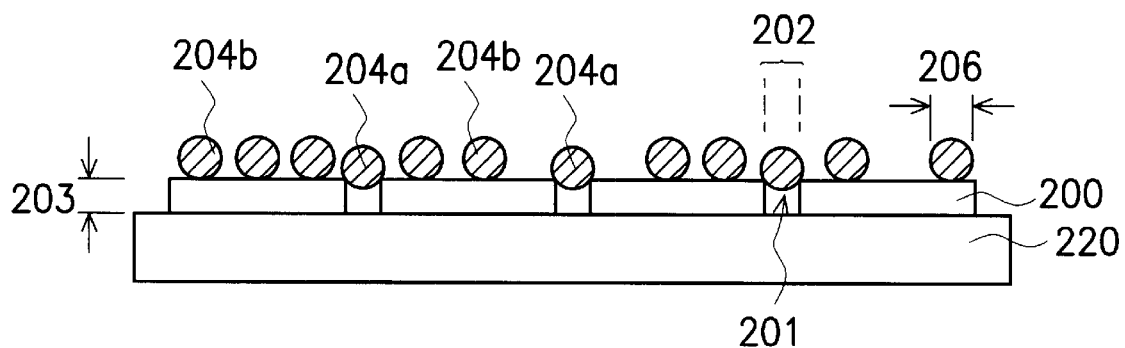
Figure 2D:
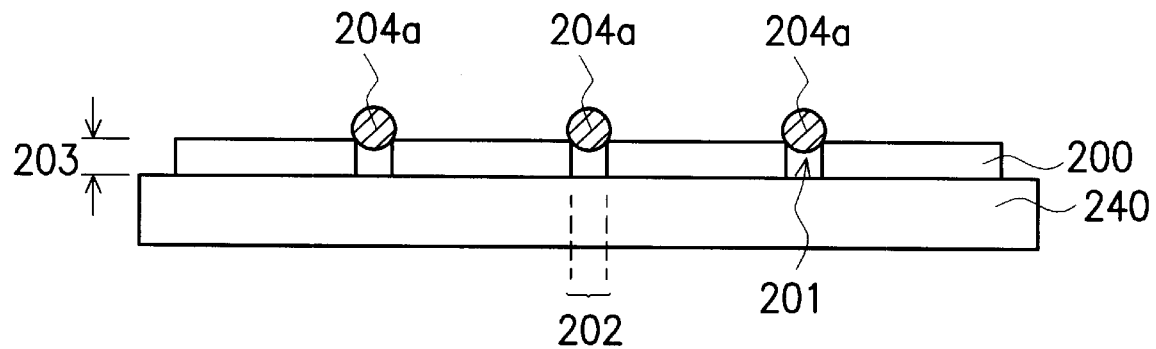

In FIG. 2C, a plurality of metal balls 204a and 204b are disposed on the substrate 200. The metal balls 204a and 204b include copper balls. When the vibration function of the platform 220 is activated, the metal balls 204a roll into the holes 201, or the metal balls 204a that have been inside of the holes 201 are further trapped in the holes 201. The metal balls 204b which do not roll into the holes 201 are then scraped using a scraper or sprayed away using a gas apparatus.

Figure 2E:
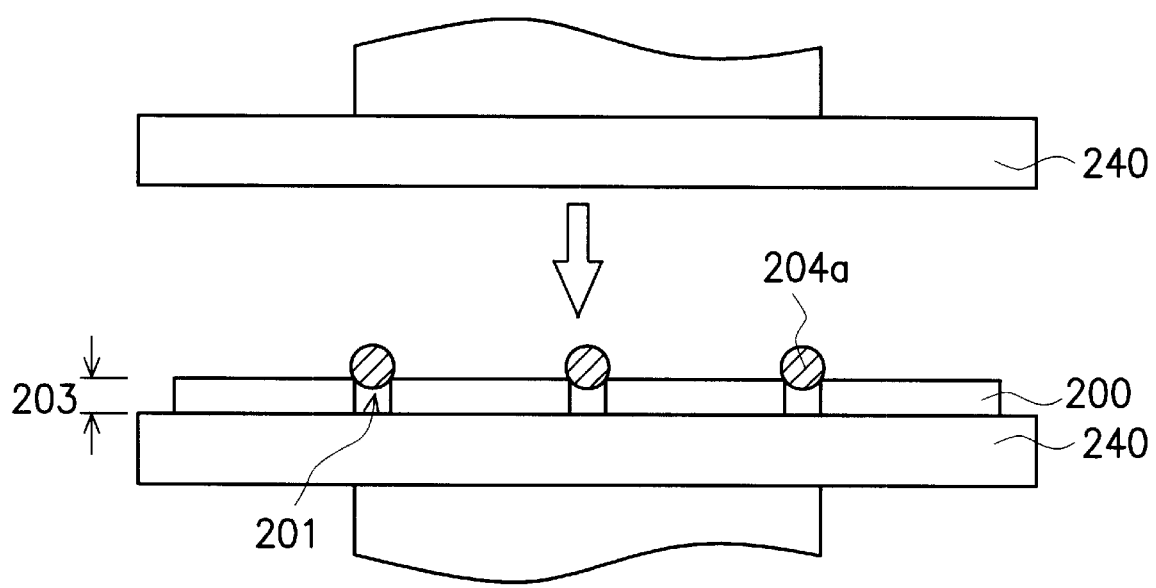

In FIG. 2E, the substrate 200 is placed on a press down unit 240. The laminating or press apparatus of the press down unit 240 is activated until the metal balls 204a in the holes 201 are level with a surface of the substrate 200. It is appreciated that the outer diameter 206 of the metal balls 204a are slightly larger than the diameter 202 of the holes 201, so that the volume of the metal balls 204a can be approximately the same as the space of the holes 201. The thickness 203 of the substrate 200 is approximately the same of the diameter 202. As result, the deformation of the metal balls 204a caused by being pressed into the holes 201 will not overflow to cause an uneven surface of the substrate 200.

Figure 2F:
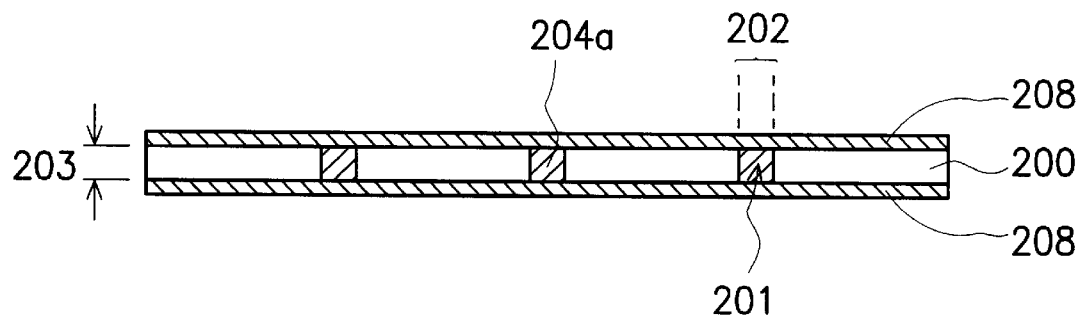

In FIG. 2F, an electroplating process is performed on the substrate 200 directly to form a plating layer 208. The material of the plating layer 208 includes copper, for example. The plating layer 208 can closely dovetail to the metal balls 204a and fill into the gap space between metal balls 204a and the holes 201 by interfusing, but also the plating layer 208 is formed on the surface.

Figure 2G:
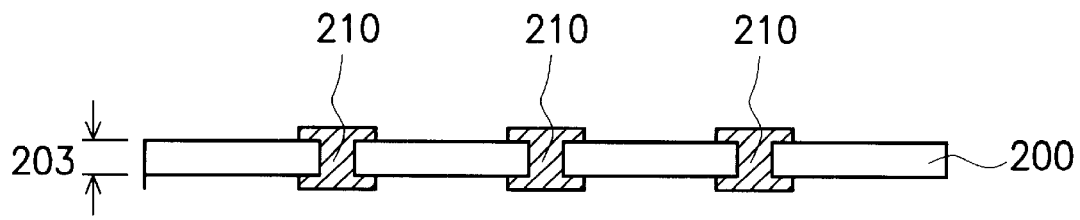

In FIG. 2G, using photolithography and etching process, the plating layer 208 is defined into a conductive wire 210. The post process of the substrate 200 is then performed until an end product of a multi-layer circuit board is formed.

According to the foregoing descriptions the invention has the following advantages:

1. The method provided by the invention can be applied to the formation of a printed circuit board having high density interconnection, such that the product can be fabricated with a more economic and faster process.
2. As the copper is used as the material of the metal balls for filing the holes, the diameter of the hole can be increased. Due to the good electrical and thermal conductivity, it can also be used for heat dissipation device such as ball grid array.
3. In the produce with high density interconnection, the mechanical via is formed to replace the laser via, so that the fabrication cost is greatly reduced.

Other embodiments of the invention will appear to those skilled in the art from consideration of the specification and practice of the invention disclosed herein. It is intended that the specification and examples to be considered as exemplary only, with a true scope and spirit of the invention being indicated by the following claims.

What is claimed is:

1. A hole metal-filling method, comprising:

providing a substrate, which has a plurality of through holes;

placing the substrate on a platform;

disposing a plurality of metal balls on the substrate;

vibrating the platform, so tat a part of the metal balls roll into the holes, while the metal balls that do not fall into the holes are removed;

placing the substrate on a press down unit to press the metal balls into the holes until the metal balls are leveled with a surface of the substrate, wherein an upper portion and a bottom portion of the metal balls come in direct contact with the press down unit; and directly electroplating the substrate to form a plating layer closely adjacent to the metal balls.

2. The method according to claim 1, wherein the substrate includes a multi-layer circuit board.

3. The method according to claim 2, wherein the multi-layer circuit board includes a substrate used in a BGA product.

4. The method according to claim 1, wherein the holes are formed using mechanical drill.

5. The method according to claim 1, wherein the metal balls include copper.

6. The method according to claim 1, wherein the plating layer includes a copper layer.

7. The method according to claim 1, wherein an outer diameter of the metal balls are slightly larger than a diameter of the holes.

8. The method according to claim 1, wherein a thickness of the substrate is larger than a diameter of the holes.

9. The method according to claim 1, wherein the metal balls are removed using a scraper.

10. The method according to claim 1, wherein the metal balls are removed using a gas apparatus.

* * * * *